United States Patent

Uchida et al.

[11] Patent Number: 6,000,122
[45] Date of Patent: *Dec. 14, 1999

[54] COMPONENT SUCTION HEAD FOR ELECTRONIC COMPONENT MOUNTING MACHINES

[75] Inventors: Kanji Uchida, Nakakoma-gun; Takashi Azuma, Kofu; Osamu Ikeda, Nirasaki, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/836,045
[22] PCT Filed: Sep. 6, 1996
[86] PCT No.: PCT/JP96/02603
  § 371 Date: May 12, 1997
  § 102(e) Date: May 12, 1997
[87] PCT Pub. No.: WO97/10696
  PCT Pub. Date: Mar. 20, 1997

[30] Foreign Application Priority Data

Sep. 13, 1995 [JP] Japan ................................. 7-235206

[51] Int. Cl.$^6$ ................................................. H05K 3/30
[52] U.S. Cl. ...................... 29/740; 29/743; 29/DIG. 44
[58] Field of Search .................... 29/DIG. 44, 743, 29/739, 740; 294/64.1

[56] References Cited

U.S. PATENT DOCUMENTS

| | | | |
|---|---|---|---|
| 4,815,779 | 3/1989 | Glessner et al. | 29/743 X |
| 4,995,662 | 2/1991 | Hawkswell | 29/743 X |
| 5,113,578 | 5/1992 | Jackson et al. | 29/743 |
| 5,317,803 | 6/1994 | Spigarelli et al. | 29/743 X |
| 5,542,726 | 8/1996 | Ozawa | 29/743 X |
| 5,707,093 | 1/1998 | Nagai et al. | 294/64.1 |
| 5,755,471 | 5/1998 | Bjorklund et al. | 294/64.1 |

FOREIGN PATENT DOCUMENTS

| | | |
|---|---|---|
| 1-281745 | 11/1989 | Japan . |
| 5-235594 | 9/1993 | Japan . |

*Primary Examiner*—Lee Young
*Assistant Examiner*—Rick Kiltae Chang
*Attorney, Agent, or Firm*—McDermott, Will & Emery

[57] ABSTRACT

An object of the present invention is to offer a component suction head for electronic component mounting machines which is capable of securely holding electronic components by suction and smoothly mounting them on printed wiring boards without dislocation. To achieve the objective, the component suction head of the present invention comprises the following. A suction nozzle unit 24 has a suction face 33 at the center of its tip, for holding electronic component 10, and a through hole 27 formed at its center which leads to the suction face 33. The back end of the through hole 27 is connected to a vacuum generator. An elastic ring 32 is fitted and fixed around the through hole 27 to the tip of the suction nozzle unit 24, slightly protruding from the suction face 33. An ejector pin 28, which can protrude from the suction face 33 for a specified length, forms an intake passage 38 from the tip to the through hole 27, and is fitted to the through hole 27 in sliding fashion. A spring means 31 supports the tip of the ejector pin 28 to protrude from the suction face 33.

4 Claims, 3 Drawing Sheets

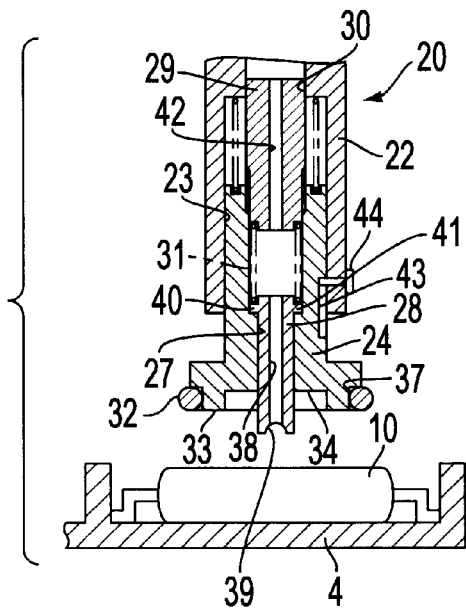
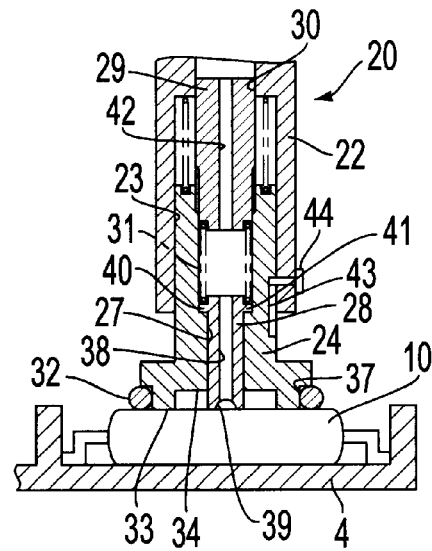
FIG. 2A    FIG. 2B
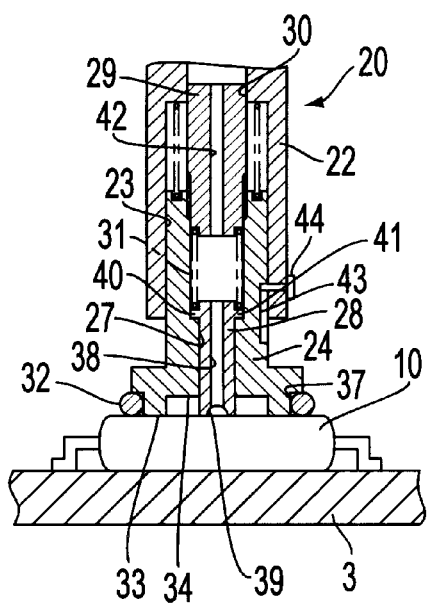
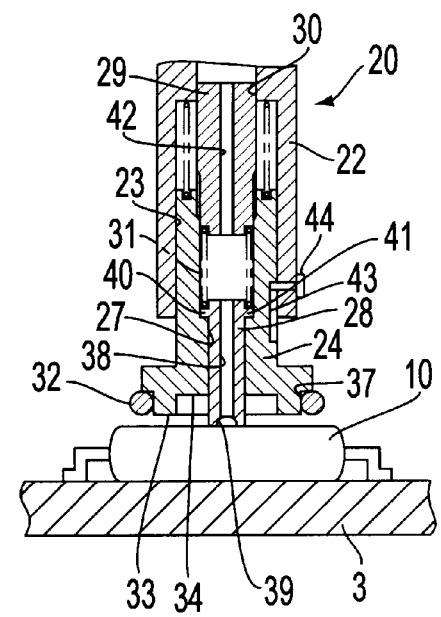
FIG. 2C    FIG. 2D

COMPONENT SUCTION HEAD FOR ELECTRONIC COMPONENT MOUNTING MACHINES

FIELD OF THE INVENTION

The present invention relates to the field of electronic component mounting machines which automatically mount a range of electronic components on printed wiring boards and, more particularly, to component suction heads which pick up electronic components by suction for mounting them on printed wiring boards.

BACKGROUND OF THE INVENTION

General configuration of electronic component mounting machines is shown in FIG. 3. A printed wiring board 3 is supplied on a transfer rail 2 from the side of a mounting machine 1, and positioned at a specified mounting area. A suction head 8 picks up by suction a component set in a parts feeder 4 disposed at the front of the mounting machine 1, transfers the component over the printed wiring board 3, and mounts it at a specified position on the printed wiring board 3.

The suction head 8 of the prior art employs a suction nozzle unit 9 at its tip as shown in FIG. 4. The suction nozzle unit 9 has a suction face 12 at the tip of its nozzle body 11 for holding an electronic component 10. A concave portion 13 for suction is formed at the center of the suction face 12, and is led to an inlet hole 14 perforated through the vertical direction along the nozzle body 11. A fitting groove 18 is disposed at the outer edge of the tip of the nozzle body 11. An O-ring 17 is fitted and fixed to the fitting groove 18, slightly protruding from the suction face 12. The suction nozzle unit 9 is connected to a vacuum generator (not illustrated) by means such as a hollow shaft.

For holding the electronic component 10 by suction, as shown in FIG. 4, the suction head 8 lowers and the suction face 12 of the suction nozzle unit 9 is pressed against the surface of the electronic component 10. The O-ring 17 deforms as illustrated by its own elasticity, and tightly contacts the surface of the electronic component 10 to form an airtight seal around the suction face 12. Then, when the vacuum pressure in the concave portion 13 for suction increases as the vacuum generator is operated, the surface of the electronic component 10 sticks to the suction face 12 and the O-ring 17. Here, the electronic component 10 is securely held by preventing air leakage with the O-ring 17 and keeping a specified vacuum pressure in the concave portion 13 for suction. After the electronic component 10 is transferred to above the specified position on the printed wiring board 3, the vacuum generator stops vacuuming operation, allowing the surface of the electronic component 10 to be released from the suction face 12 and the O-ring 17.

An advantage of the suction head 8 employing the above conventional suction nozzle unit 9, compared to existing suction nozzle units which use a diamond, is its reliable holding power by means of improvement of the vacuum rate for the electronic component 10 with the use of the O-ring 17. On the other hand, however, the O-ring 17 may not smoothly separate from the electronic component 10 when the vacuum is switched off at mounting the electronic component 10 on the printed wiring board 3, due to its own viscosity, because the O-ring 17 is made of a material such as rubber. In some cases, the electronic component 10 sticks to the O-ring 17 as the suction head 8 rises, and the component bounces or slightly moves on the printed wiring board 3. Therefore, the prior art has a disadvantage in mounting the electronic component 10 accurately on the printed wiring board 3, making it difficult to realize high density mounting of electronic components 10.

DISCLOSURE OF THE INVENTION

An object of the present invention is to offer a component suction head for electronic component mounting machines which can securely hold electronic components and smoothly mount them on printed wiring boards without dislocation.

To achieve the object, the present invention relates to a component suction head for electronic component mounting machines for holding electronic components by suction and mounting them on boards which comprises the following. A suction nozzle unit has a suction face at its tip for holding electronic components. A through hole is perforated at the center of the suction nozzle unit, and one end reaches the suction face and the other end at the back is connected to a vacuum generator. An elastic ring is fitted and fixed around the through hole at the tip of the suction nozzle unit, slightly protruding from the suction face. An ejector pin is fitted in sliding fashion to the through hole and its tip can protrude from the suction face for a specified length. An intake passage is formed from the tip of the ejector pin to the through hole. A spring means supports the tip of the ejector pin to protrude from the suction face.

Furthermore, an air inlet opening which leads to the intake passage is provided at a tip of the ejector pin

BRIEF DESCRIPTION OF THE DRAWINGS

FIG. 2 is a vertical section view illustrating the process of picking up by suction and mounting electronic components using the component suction head of the present invention.

DESCRIPTION OF THE PREFERRED EMBODIMENTS

In the present invention, when the suction face of a suction nozzle unit is pressed against the surface of an electronic component, the electronic component presses an ejector pin back into the suction nozzle unit, against the support force of a spring means. Although the support force of the spring, which is equivalent to the restoring force, is applied to the electronic component, air leakage between a through-hole and the electronic component can be prevented because the vacuum suction power generated by operating a vacuum generator is applied to the electronic component through the through hole of the suction nozzle and the intake of the ejector pin. Air leakage is also prevented by an elastic ring which elastically deforms to tightly contact the surface of the electronic component. Thus, the electronic component is securely sucked and held by the suction face and elastic ring of the suction nozzle unit.

Then, when the suction head rises, after the electronic component is mounted on a board and the vacuum generator stops, the ejector pin protrudes from the suction face due to the restoring force of the spring means and presses the surface of the electronic component. This enables the elastic ring to smoothly release the electronic component, and thereby assuring accurate mounting of the electronic component on the printed wiring board.

An exemplary embodiment of the present invention is explained below with reference to drawings.

Figure 1:
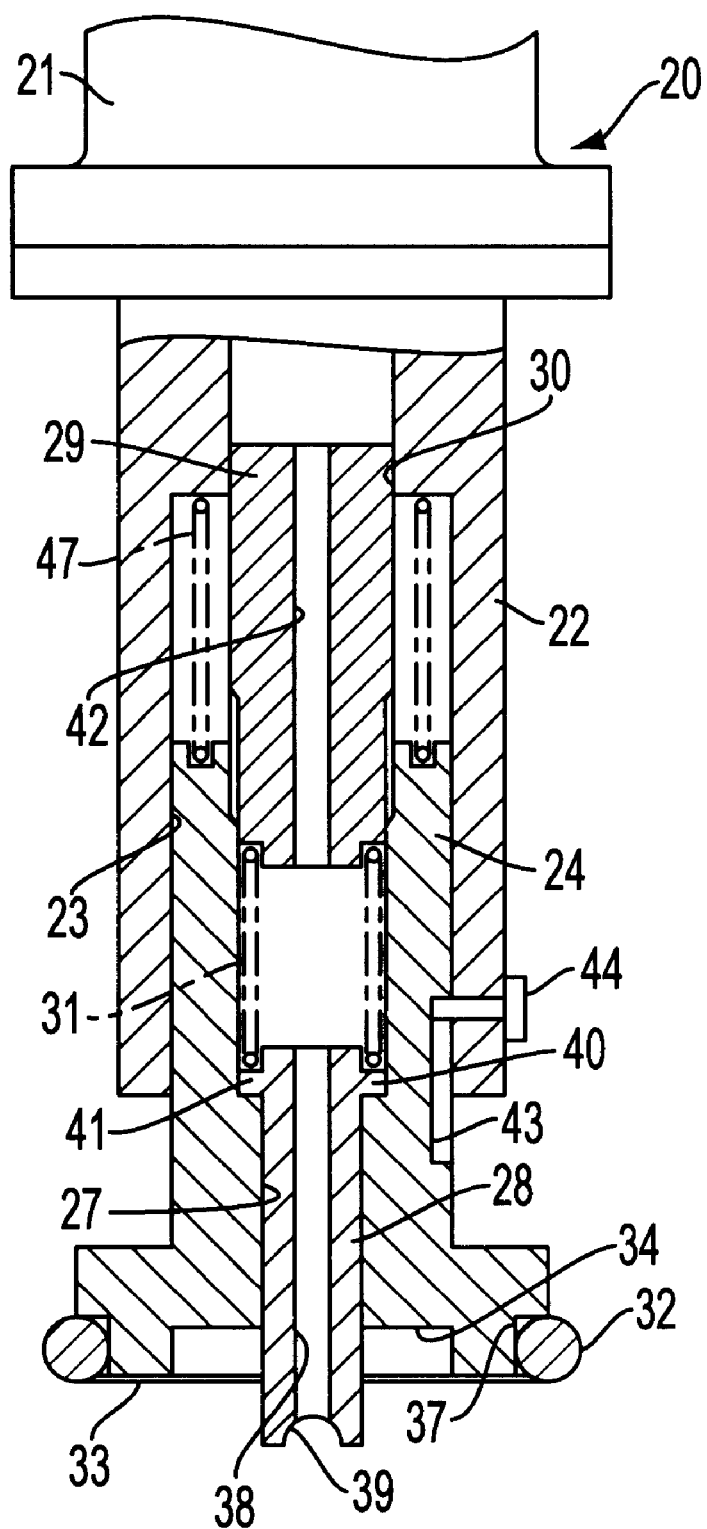
FIG. 1 is a vertical section view of a part concerned of a component suction head of an exemplary embodiment of the present invention.
Figure 3:
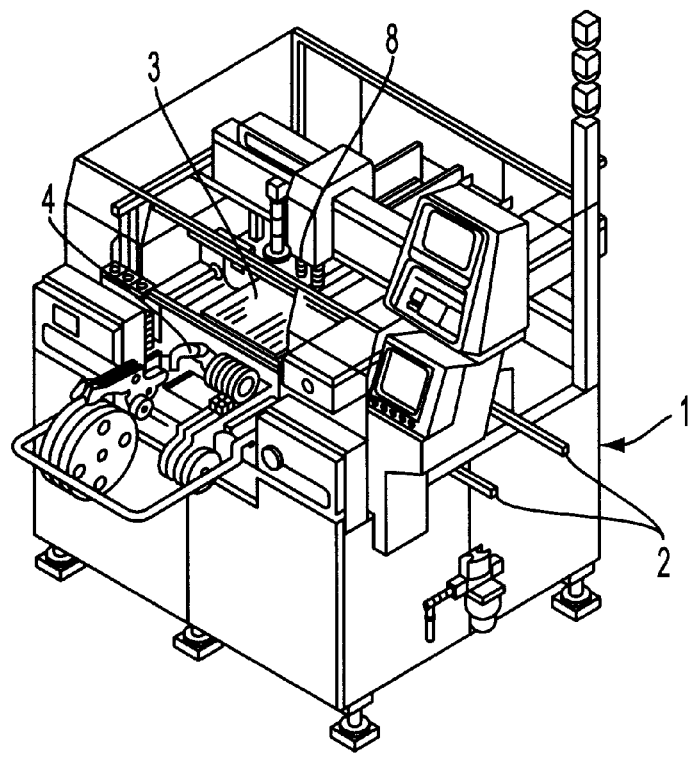
FIG. 3 is a perspective of an electronic component mounting machine applicable to the present invention and component suction heads of the prior art.
Figure 4:
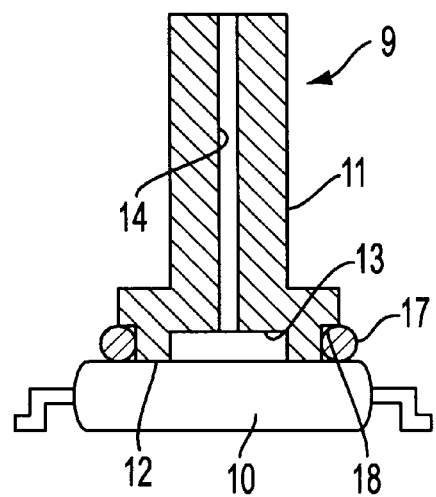
FIG. 4 is a vertical section view of the conventional component suction head.

FIG. 1 is a vertical section view of a part concerned illustrating a component suction head 20 of an exemplary embodiment of the present invention which is mountable on electronic component mounting machines shown in FIG. 3. The component suction head 20 is attached to a hollow shaft 21 connected to a vacuum generator (not illustrated) and comprises the following. A hollow shaft 22 comprises a small-diameter holding hole 30 and a large-diameter holding hole 23 at its core. A suction nozzle unit 24 is disposed in sliding fashion inside the large-diameter holding hole 23 of the hollow shaft 22. An ejector pin 28 is fitted in sliding fashion into the through hole 27 of the suction nozzle unit 24. A holder 29 is disposed on top of the ejector pin 28 and screwed to the top end of the suction nozzle unit 24, and its upper part is held in sliding fashion with the small-diameter holding hole 30 of the hollow shaft 21. A spring means 31 consists of a coil spring and is provided between the holder 29 and the ejector pin 28 for supporting downward movement of the ejector pin 28. An elastic ring 32 consists of an O-ring and is fitted and fixed around the bottom end of the suction nozzle unit 24.

The lower end face of the suction nozzle unit 24 forms a suction face 33 which contacts an electronic component 10 in the same way as in conventional nozzle units. A concave portion 34 for suction which leads to the through-hole 27 is provided at the center of the suction face 33. The elastic ring 32 is fitted and fixed to a fitting groove 37 of the suction nozzle unit 24, slightly protruding from the suction face 33. The ejector pin 28 comprises an inlet hole (intake) 38 which is a through hole along the shaft. An air inlet opening 39 is provided at the bottom end of the ejector pin 28 by engraving the bottom end in a U shape so that the inlet hole 38 is led to the outer air by the air inlet opening 39 from the side of the tip face.

The ejector pin 28 has a catch rib 40 projecting from its top part. The bottom tip of the ejector pin 28 protrudes from the suction face 33 for a specified length by the support force of the elastic ring 32 when the catch rib 40 is pressed against a catch step 41 of the suction nozzle unit 24. An inlet hole 42 which is a through hole along the shaft is provided on the holder 29, and accordingly, a vacuum exhaust passage is formed through the inlet hole 38 of the ejector pin 28, the through hole 27 of the suction nozzle unit 24, the inlet hole 42, the small-diameter holding hole 30, and the hollow shaft 21 to the vacuum generator.

This exemplary embodiment is capable of balancing the difference in thickness of the electronic component 10. At one side of the suction nozzle unit 24 which is disposed in sliding fashion in the hollow shaft 22, a guide groove 43 is provided in the sliding direction of the suction nozzle unit 24, and a tip of a guide pin 44, which is attached through the hollow shaft, fits in sliding fashion into the guide groove 43. Under normal conditions, a coil spring 47 provided between the suction nozzle unit 24 and the hollow shaft 22 supports the suction nozzle unit 24 downward. In this state, the suction nozzle unit 24 is held at the lower limit position where the guide pin 44 contacts the upper end of the guide groove 43. The range of up/down movement of the suction nozzle unit 24 is restricted by the guide pin 44 and the guide groove 43, and the suction nozzle unit 24 can be drawn back in the hollow shaft 22 from the above lower limit position to the upper limit position where the guide pin 44 contacts the lower end of the guide groove 43.

The operation of the component suction head 20 is explained with reference to FIG. 2.

As shown in FIG. 2 (*a*), when the suction head 20 does not contact the electronic component 10 in the normal state, the ejector pin 28 is forced to protrude from the suction face 33 by the support force of the spring means 31 for a specified length, and the suction nozzle unit 24 is held at the lower limit position. Under these conditions, the component suction head 20, as marked by the arrow in FIG. (*a*), lowers towards the surface of the electronic component 10 in a parts feeder 4, and the suction face 33 is pressed against the surface (top face) of the electronic component 10, as shown in FIG. 2 (*b*).

When the suction face 33 of the suction nozzle unit 24 is pressed against the electronic component 10, the tip of the ejector pin 28 contacts and is subsequently pressed back by the electronic component 10, and the ejector pin 28 is drawn into the suction nozzle unit 24, against the support force of the spring 31, until the tip becomes level with the suction face 33 as shown in FIG. 2 (*b*). The suction nozzle unit 24 is drawn into the hollow shaft 22, as the coil spring 47 is compressed by the electronic component 10, in order to balance the difference in the thickness of the electronic component 10.

At this point, the vacuum generator operates and increases the degree of vacuum in the concave portion 34 for suction through the aforementioned vacuum exhaust passage and the air inlet opening 39. The suction force lifts the electronic component 10 toward the suction face 33 and the elastic ring 32. Here, the restoring force of the compressed spring 31 exits when the ejector pin 28 is drawn into the suction nozzle unit 24, and this force, the support force equivalent to the restoring force, is applied to the electronic component 10. In other words, a force is applied which acts to release the electronic component 10 away from the suction nozzle unit 24. However, the suction face 33 of as the suction nozzle unit 24 and the elastic ring 32 are capable of securely holding the electronic component 10 by suction because the suction power of the vacuum generator is applied to the electronic component 10 and the elastic ring 32 deforms to tightly contact with the surface of the electronic component 10, thus forms airtight seal around the concave portion 34 for suction to prevent air leakage.

Next, after the component suction head 20 rises, holding the electronic component 10 by suction, it moves over the specified mounting position on a printed wiring board 3 and lowers to mount the electronic component 10 on the printed wiring board 3 as shown in FIG. 2 (*c*). When the component suction head 20 rises after the vacuum generator switches off, the ejector pin 28 protrudes downward for the specified length from the suction face 33 by the restoring force of the spring means 31, and presses the surface of the electronic component 10 after it is released from the suction power as shown in FIG. (*d*). Since the ejector pin 28 forcibly releases the electronic component 10, the elastic ring 32 smoothly and effortlessly separates from the electronic component 10. Consequently, the electronic component 10 can be mounted on the printed wiring board 3 without any dislocation.

In the above exemplary embodiment, the inlet hole 38 is provided in the ejector pin 28 along the shaft as an air intake for vacuuming air with the vacuum generator. Such air intake could be provided between the ejector pin 28 and the suction nozzle unit 24 by creating a groove in a vertical direction on either the ejector pin or the suction nozzle unit 24. Also the exemplary embodiment provides the air inlet opening 39 by engraving the bottom end of the ejector pin 28 in a U shape. Such opening could also be made at the side of the ejector pin 28 which leads to the inlet hole 38. Furthermore, if the air intake is provided between the ejector pin 28 and the suction nozzle unit 24 as mentioned above, there is no need to provide a separate air inlet opening. In other words, as long as the inlet hole 38 is not blocked by the electronic component 10 when the flat tip of the ejector pin 28 contacts the surface of the electronic component 10, any structure is embraced in the scope of the present invention.

Industrial Applicability

As described above, the present invention is capable to securely hold electronic components by suction power of the vacuum generator applied to the electronic component through the through hole of the suction nozzle unit and the intake of the ejector pin, and by the elastic ring which deforms and tightly contacts the surface of the electronic component to prevent air leakage. At mounting the electronic component, the ejector pin protrudes from the suction face by the restoring force of the spring and presses the surface of the electronic component to forcibly release the electronic component from the elastic ring. Thus, the present invention is capable of mounting the electronic component on the printed wiring board without any dislocation.

What is claimed is:

1. A component suction head for electronic component mounting machines for holding electronic components by suction and mounting said components on boards comprising:
    a suction nozzle unit, which has a suction face at a tip of said suction nozzle unit for holding electronic components, and a through hole in a center of the suction nozzle unit, one end of said through hole located at the suction face and another end of said through hole located at an end of said suction nozzle unit opposite to said tip for communication to a vacuum generator;
    an elastic ring fitted and fixed around said suction nozzle unit at the tip of the suction nozzle unit, said elastic ring slightly protruding from said suction face;
    an ejector pin slidably fitted in said through hole, said ejector pin having an end portion and an air inlet opening formed from a tip of said end portion of the ejector pin to said through hole; and
    a spring, biasing the ejector pin, so that said end portion of said ejector pin protrudes from said suction face by a specified length in the absence of a vacuum from said vacuum generator, wherein
    when said suction face holds an electronic component at an upper surface thereof and said vacuum generator provides the vacuum, said ejector pin is drawn into said through hole compressing said spring and said end portion of said ejector pin does not protrude from said suction face, and
    when said vacuum generator stops providing the vacuum while said suction face holds said electronic component, a restoring force of the compressed spring pushes the ejector pin to protrude an end portion from said suction face and press said upper surface of the electronic component.

2. The component suction head for electronic component mounting machines as defined in claim 1,
    wherein an air inlet opening, which leads to said through hole is provided at the tip of said end portion of said ejector pin.

3. A component suction head for electronic component mounting machines for holding electronic components by suction and mounting said components on boards comprising:
    a suction nozzle unit, which has a suction face at a tip of said suction nozzle unit for holding electronic components, and a through hole in a center of the suction nozzle unit, one end of said through hole located at the suction face and another end of said through hole located at an end of said suction nozzle unit opposite to said tip for communication to a vacuum generator;
    an elastic ring fitted and fixed around said suction nozzle unit at the tip of the suction nozzle unit, said elastic ring slightly protruding from said suction face;
    an ejector pin slidably fitted in said through hole, said ejector pin having an end portion and an air inlet opening formed from a tip of said end portion of the ejector pin to said through hole; and
    a spring, biasing the ejector pin, so that said end portion of said ejector pin protrudes from said suction face during mounting, wherein
    when said suction face holds an electronic component at an upper surface thereof and said vacuum generator provides a vacuum, said ejector pin is drawn into said through hole compressing said spring and said end portion of said ejector pin does not protrude from said suction face, and
    when said vacuum generator stops providing the vacuum while said suction face holds said electronic component, a restoring force of the compressed spring pushes the ejector pin to protrude said end portion from said suction face and press said upper surface of the electronic component.

4. A method of mounting an electronic component on a board comprising the steps of:
    sucking an electronic component with a suction unit for holding said electronic component;
    transferring said electronic component to a specified mounting position on a board;
    stopping sucking; and
    pressing said electronic component after sucking stops with an end portion of an ejector pin that is slidably fitted in a through hole in said suction unit, to release said electronic component from said suction unit.

* * * * *